United States Patent [19]

Fisher

[11] Patent Number: 5,140,276
[45] Date of Patent: Aug. 18, 1992

[54] ARMATURE CONNECTION RESISTANCE MEASURING METHOD AND APPARATUS

[75] Inventor: James A. Fisher, Dayton, Ohio

[73] Assignee: Automation Technology, Inc., Dayton, Ohio

[21] Appl. No.: 679,380

[22] Filed: Apr. 2, 1991

[51] Int. Cl.$^5$ .................... G01R 27/14; G01R 27/08
[52] U.S. Cl. .................... 324/713; 324/545; 324/715
[58] Field of Search .............. 324/545, 691, 713, 715, 324/718

[56] References Cited

U.S. PATENT DOCUMENTS

| | | | |
|---|---|---|---|
| 2,890,407 | 6/1959 | Huehn et al. | 324/545 |
| 3,590,373 | 6/1971 | Lake | 324/691 |
| 3,746,979 | 7/1973 | Kildishev et al. | 324/545 |
| 3,896,376 | 7/1975 | Sinniger | 324/545 X |
| 4,651,086 | 3/1987 | Domenichini et al. | 324/715 |

Primary Examiner—Kenneth A. Wieder
Assistant Examiner—Glenn W. Brown
Attorney, Agent, or Firm—Biebel & French

[57] ABSTRACT

A method and apparatus for testing the resistance of armature commutator connections and the resistance values of individual windings uses a pair of independent constant current sources connected across opposite pairs of armature windings through their respective commutator bars. The constant current sources are identical in output current and are connected in opposite polarity to minimize circulating current flowing in other windings of the armature. The voltages developed across windings adjacent the two current sources are combined and are a function of the resistances of the connections between the windings and the commutator bars. The voltages across each constant current source represent the resistance of the winding to which it is connected.

4 Claims, 3 Drawing Sheets

ARMATURE CONNECTION RESISTANCE MEASURING METHOD AND APPARATUS

BACKGROUND OF THE INVENTION

This invention relates to a method and apparatus for testing the resistance between the windings of an electric motor and a terminal connector. Specifically, this invention relates to a motor armature tester for measuring the resistance of individual windings and the contact resistance between a commutator bar and the windings connected thereto.

In testing motor armatures, especially on high speed production lines, the resistance of the windings themselves is measured, and then the resistance of the connection between the windings and the commutator is determined. In a typical appliance motor, the resistance measured across a pair of commutator bars is in the order of 200 mOhm whereas the maximum permissible contact resistance between the windings and the commutator is about 0.1% of that amount, or about 0.2 mOhm. Since the tolerance on the winding resistance is approximately ±5%, or from ±10 mOhm in this example, this tolerance clearly is far greater than the expected variation in connection resistance, thus requiring careful and accurate measurement techniques to be used.

SUMMARY OF THE INVENTION

The present invention relates to a method and apparatus for testing the resistance of armature commutator connections and the resistance values of individual windings.

Motor armatures typically include a plurality of series connected windings each connected to commutator bars. The combined connection resistance is determined by applying a first source of constant current across a first armature winding through its commutator bars, and a second source of constant current across a second armature winding through its commutator bars. Preferably, the armature windings chosen are opposite each other since they have the same number of turns and almost equal resistances if the armature was made by a double flyer machine.

The constant current sources are designed to provide controlled or regulated sources of current, and both sources are essentially equal in output current and completely independent from each other. This arrangement permits an armature to be tested quickly and accurately since the number of set up steps is only one half the number of windings.

The current sources are connected in opposite polarity to the commutator bars of the armature to minimize the circulating current flowing through other windings. The voltages developed across windings adjacent the two current sources are measured as a function of the resistance of the connections between the windings and the commutator bars. These voltages are combined and represent the combined resistance of the commutator connections. The voltages across each constant current source represent the resistance of the winding to which it is connected.

It is therefore an object of this invention to provide a method of testing the resistance of armature commutator connections in armatures of the type including a plurality of series connected windings each connected to commutator bars, said method comprising the steps of applying a first source of constant current across a first armature winding through its commutator bars, applying a second source of constant current across a second armature winding through its commutator bars, said first and second constant current sources being approximately equal in output current and completely independent from each other, measuring a first voltage developed across a pair of commutator bars adjacent said first source of constant current, measuring a second voltage developed across a pair of commutator bars adjacent said second source of constant current, and determining the combined resistance of the measured connections by combining said first and second voltages. It is a further object further to include the step of independently measuring the voltage across each of said constant current sources as a measure of the resistance of the armature windings across which the current sources are connected.

It is a further object of this invention to provide an apparatus for testing the resistance of armature commutator connections in armatures of the type including a plurality of series connected windings each connected to commutator bars, said apparatus comprising first current source means for applying a first source of constant current across a first armature winding through its commutator bars, second current source means for applying a second source of constant current across a second armature winding through its commutator bars, said first and second constant current sources being approximately equal in output current and completely independent from each other, means for measuring a first voltage developed across a pair of commutator bars adjacent said first source of constant current, means for measuring a second voltage developed across a pair of commutator bars adjacent said second source of constant current, and means for determining the combined resistance of the measured connections by adding said first and second voltages.

Other objects and advantages of the invention will be apparent from the following description, the accompanying drawings and the appended claims.

DESCRIPTION OF THE PREFERRED EMBODIMENT

Figure 1:
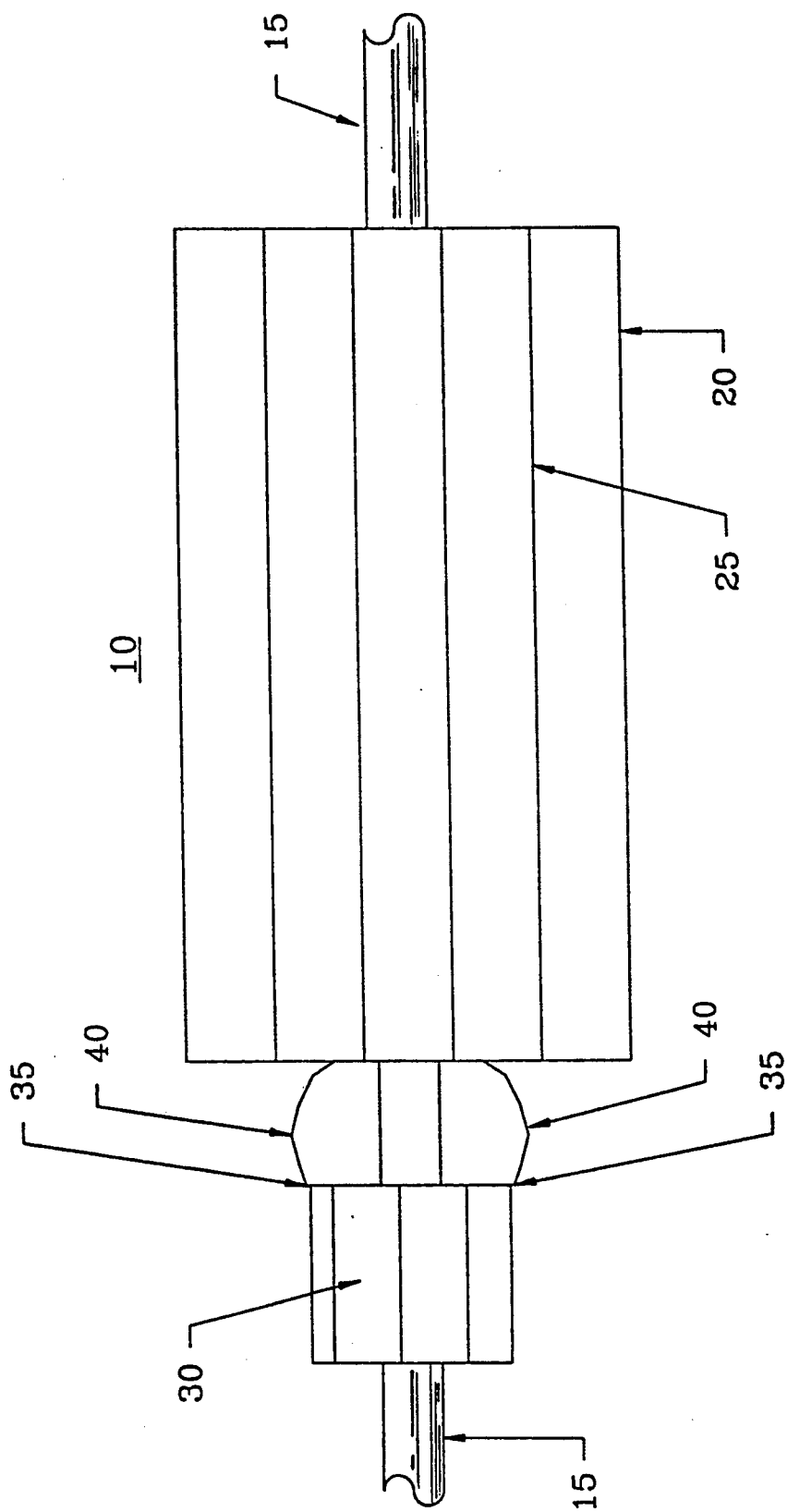
FIG. 1 is an elevational view illustrating the construction of a typical motor armature.

Referring now to the drawings, and particularly to FIG. 1, a typical motor armature 10 includes a shaft 15, an armature stack 20 containing a plurality of armature windings 25, and a commutator assembly 30 including a plurality of commutator bars each having tabs or tangs 35 to which are connected wires 40 from each of the windings 25. This connection may be made by staking or by welding according to the type of armature being manufactured. It is the resistance between the tangs 35 and the wires 40 that is to be measured by this invention.

Figure 2:
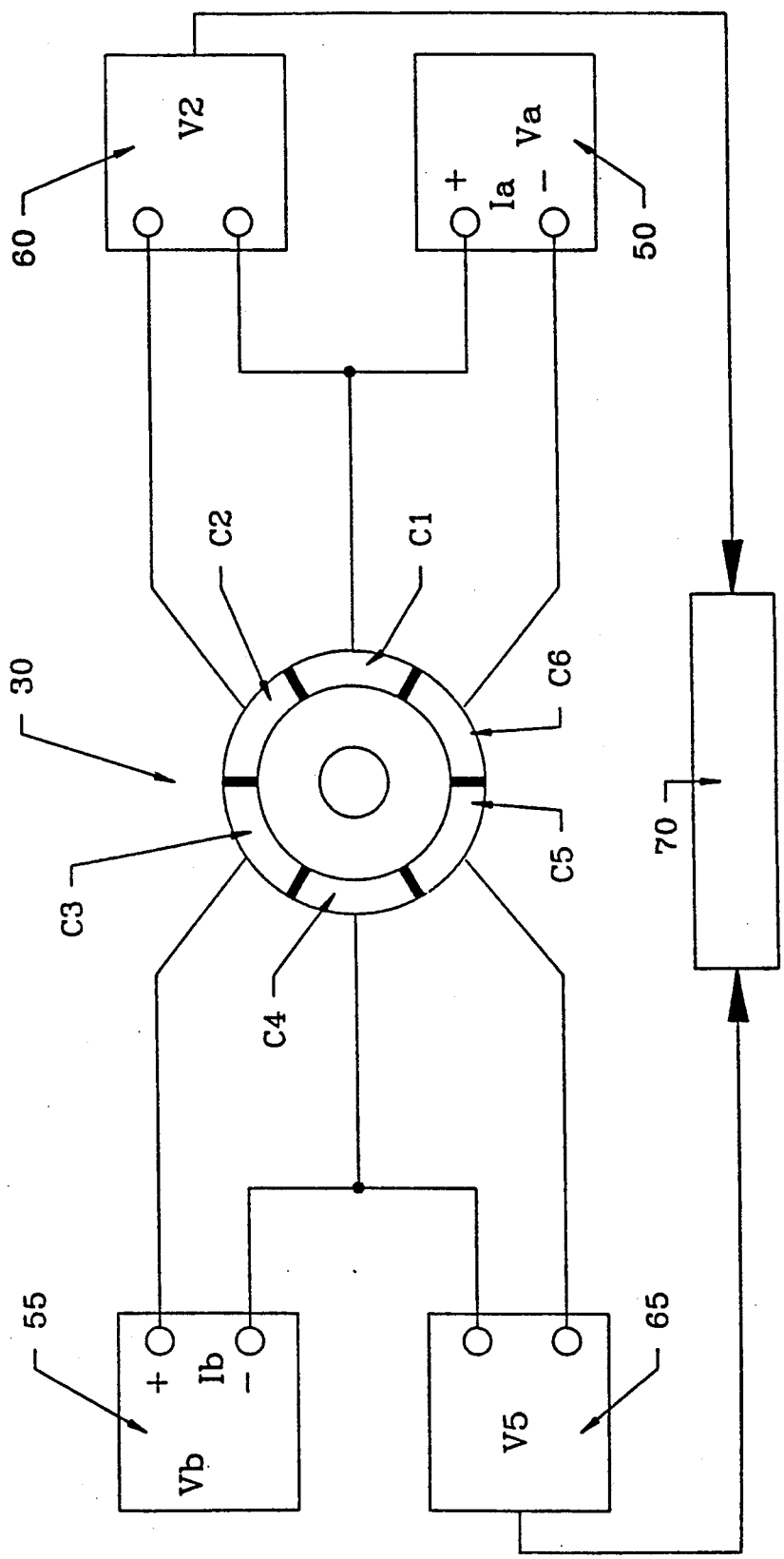
FIG. 2 is an electrical block diagram showing the armature connection test setup.
Figure 3:
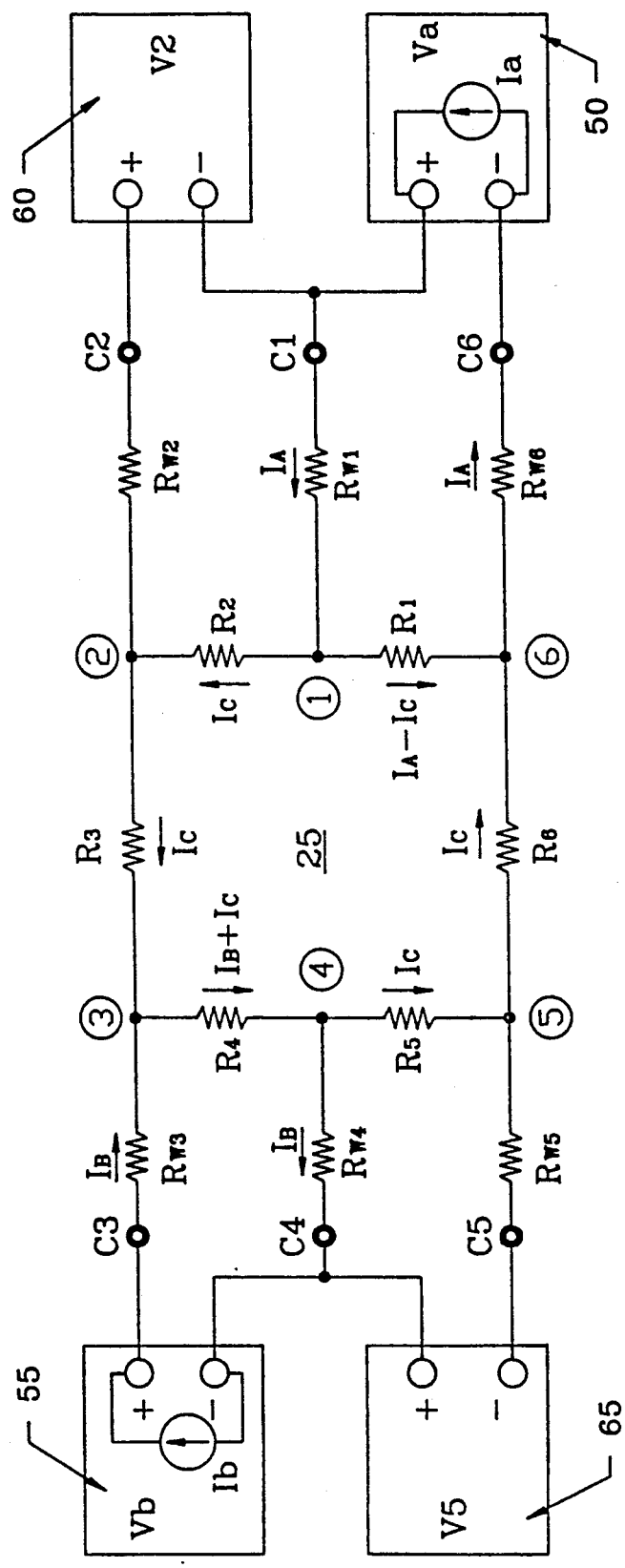
FIG. 3 is an electrical schematic diagram of the present invention.

Referring now to FIGS. 2 and 3, FIG. 2 shows the connection between the components of the present invention and the commutator 30. For illustration purposes and for simplicity, a six winding motor is shown; however it is to be understood that the method and apparatus of this invention can be used with other types of motor armatures. The commutator 30 has six commutator bars labeled C1-C6.

In FIG. 3, the armature contains six windings 25, represented by resistors $R_1$-$R_6$, connected in series. The resistance between the wires 40 between the windings 25 and the commutator tangs 35 is also represented by resistors; thus, resistor $R_{W1}$ represents the resistance between the tang extending from commutator bar C1 and the wire 40 that is connected to windings $R_1$ and $R_2$. Similarly, resistors $R_{W2}$-$R_{W6}$ represent the resistance in the connections between the commutator bars C2-C6 and the other windings 25 of the armature 10.

A first source of electrical current 50 is shown as being connected between commutator bars C6 and C1, and a second source of current 55 is shown as being connected between commutator bars C3 and C4. Both sources of current 50 and 55 are constant current sources which are completely independent of one another and are accurately regulated to provide currents $I_A$ and $I_B$, respectively, of approximately 1 ampere into a load of approximately 200 mOhms. As shown, the polarity of the current sources are opposed in order to minimize a circulating current $I_C$ which will normally flow through the windings 25.

The voltage developed across adjacent commutator bars C1 and C2 is detected by a first voltage measuring means 60 while the voltage across commutator bars C4 and C5 is detected by a second voltage measuring means 65. Each voltage measuring means shares a common commutator connection with its corresponding constant current source and therefore it will measure the voltage developed across the tang 35 and wire 40 interface in addition to any voltage that might be developed across the winding as a result of any circulating current $I_C$.

The outputs of the voltage measuring means 60 and 65 are combined in a decision circuit 70 which provides an indication of whether the connection resistance is within acceptable limits.

Referring now to FIG. 3 for a more detailed explanation of the present invention, and again by way of a simplified illustration, it is first noted that the two constant current sources 50 and 55 are calibrated to be approximately equal; thus $I_A = I_B$. Furthermore, the current sources are completely isolated from each other. Also, the resistances of the armature windings are approximately equal. Usually the two winding opposite each other on armatures manufactured by a double flyer winding machine are very close to being equal since they have the same number of turns and same overlay pattern; thus, $R_1 \approx R_4$, $R_2 \approx R_5$, and $R_3 \approx R_6$.

For the purpose of illustration, it will be assumed that the resistances are not quite equal and $R_1$ is greater than $R_4$, so a circulating current $I_C$ will flow in a counterclockwise direction, as shown in FIG. 3. The circulating current will be much smaller than the current from either constant current source, typically less than 1%, since the voltages generated across windings $R_1$ and $R_4$ are approximately, but often not exactly, equal.

The voltage $V_2$ across the commutator bars C1 and C2, as measured by voltage measuring means 60, is therefore equal to the combined voltages developed as a result of current flow across resistors $R_{W1}$ and $R_2$, or in other words, $V_2 = I_A R_{W1} + I_C R_2$. Similarly, the voltage $V_5$ across the commutator bars C4 and C5, as measured by voltage measuring means 65, is $V_5 = I_B R_{W4} - I_C R_5$; this is a difference voltage since we are assuming the circulating current $I_C$ is flowing in the direction of the arrows.

Thus, $$V_2 = I_A R_{W1} + I_C R_2$$

$$V_5 = I_B R_{W4} - I_C R_5.$$

Since the voltage drops across windings $R_2$ and $R_5$ are approximately equal and cancel each other, therefore, $V_2 + V_5 = I_A R_{W1} + I_B R_{W4}$ or, $(R_{W1} + R_{W4}) = (V_2 + V_5)/I_A$. It should be noted that the magnitude of the circulating current, if any, is essentially canceled, regardless of which direction the circulating current $I_C$ flows. Further, since the current $I_A$ is known, and may be set to any value, such as 1 ampere, then the only necessary calculation is the addition of voltages $V_2$ and $V_5$ in order to determine the combined resistances of the connections.

In addition to determining the resistance of the connections to the tangs 35, as represented by resistors $R_{W1}$-$R_{W6}$, it is possible at the same time to determine the resistance values $R_1$-$R_6$ of the individual windings 25. This is done by measuring the voltages $V_A$ and $V_B$ developed across current sources 50 and 55. For example, the value of windings $R_1$ and $R_4$ can be computed as follows:

$$V_A = I_A R_{W1} + (I_A - I_C) R_1 + I_A R_{W6}$$

$$V_B = I_B R_{W3} + (I_B + I_C) R_4 + I_A R_{W4}$$

or $$V_A = I_A R_1 - I_C R_1 + I_A (R_{W1} + R_{W6})$$

$$V_B = I_B R_4 + I_C R_4 + I_A (R_{W3} + R_{W4})$$

The values of $(R_{W1} + R_{W6})$ and $(R_{W3} + R_{W4})$ are normally insignificant compared to $R_1$ or $R_2$; however, it can be closely approximated by $$(R_{W1} + R_{W6}) = (R_{W3} + R_{W4}) = (R_{W1} + R_{W4} + R_{W3} + R_{W6})/2$$

The voltages created by $I_C R_1$ and $I_C R_4$ may be significant compared to $I_A R_1$ and $I_B R_5$ depending on the differential resistance of $R_1$ and $R_4$ and the total number of windings in the armature. Because all coil resistance values in the windings are approximately equal and $I_C$ is considerably less than $I_A$, the value of $I_C R_1$ and $I_C R_4$ is approximately equal to the average voltage drop across each of the remaining windings of the coil. Therefore, $$I_C R_1 \approx I_C R_4 \approx (V_A - V_B)/(N-2)$$

where N = number of coils.

Now, $$V_A = I_A R_1 - (V_A - V_B)/(N-2) + I_A(R_{W1} + R_{W4} + R_{W3} + R_{W6})/2$$

$$V_B = I_B R_4 + (V_A - V_B)/(N-2) + I_B(R_{W1} + R_{W4} + R_{W3} + R_{W6})/2$$

or $$R_1 = (V_A + (V_A - V_B)/(N-2))/I_A - (R_{W1} + R_{W4} + R_{W3} + R_{W6})/2$$

$$R_2=(V_B-(V_A-V_B)/(N-2))/I_B-(R_{W1}+R_{W4}+R_{W3}+R_{W6})/2$$

The present invention therefore provides for the quick determination of both the resistance of the individual windings in an armature and the connection resistance between the windings and the commutator, a pair of windings at a time. Thus, with the present invention, the number of set-up steps required to obtain the resistance values for all windings and commutator connections is one-half the number of windings (plus one-half for an armature with an odd number of windings), and therefore the present invention effects a great savings in testing time.

While the form of apparatus herein described constitutes a preferred embodiment of this invention, it is to be understood that the invention is not limited to this precise form of apparatus and that changes may be made therein without departing from the scope of the invention, which is defined in the appended claims.

What is claimed is:

1. A method of testing the resistance of armature commutator connections in armatures of the type including a plurality of series connected windings each connected to commutator bars, said method comprising the steps of
    applying a first source of constant current across a first armature winding through its commutator bars,
    applying a second source of constant current across a second armature winding through its commutator bars,
    said first and second constant current sources being approximately equal in output current and completely independent from each other,
    measuring a first voltage developed across a pair of commutator bars adjacent said first source of constant current,
    measuring a second voltage developed across a pair of commutator bars adjacent said second source of constant current, and
    determining the combined resistance of the measured connections by combining said first and second voltages.

2. The method of claim 1 further including the step of independently measuring the voltage across each of said constant current sources as a measure of the resistance of the armature windings across which the current sources are connected.

3. The method of claim 1 wherein said first and said second armature windings are positioned 180° apart on said armature.

4. An apparatus for testing the resistance of armature commutator connections in armatures of the type including a plurality of series connected windings each connected to commutator bars, said apparatus comprising
    first current source means for applying a first source of constant current across a first armature winding through its commutator bars,
    second current source means for applying a second source of constant current across a second armature winding through its commutator bars,
    said first and second constant current sources being approximately equal in output current and completely independent from each other,
    means for measuring a first voltage developed across a pair of commutator bars adjacent said first source of constant current,
    means for measuring a second voltage developed across a pair of commutator bars adjacent said second source of constant current, and
    means for determining the combined resistance of the measured connections by adding said first and second voltages.

* * * * *